United States Patent
Ueda et al.

(10) Patent No.: US 9,343,115 B2
(45) Date of Patent: May 17, 2016

(54) NONVOLATILE SEMICONDUCTOR MEMORY DEVICE

(71) Applicant: PANASONIC INTELLECTUAL PROPERTY MANAGEMENT CO., LTD., Osaka (JP)

(72) Inventors: Takanori Ueda, Kanagawa (JP); Kazuyuki Kouno, Osaka (JP); Yasuo Murakuki, Kyoto (JP); Masayoshi Nakayama, Kyoto (JP); Yuriko Ishitobi, Osaka (JP); Keita Takahashi, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/656,689

(22) Filed: Mar. 12, 2015

(65) Prior Publication Data

US 2015/0187393 A1 Jul. 2, 2015

Related U.S. Application Data

(63) Continuation of application No. PCT/JP2013/006400, filed on Oct. 29, 2013.

(30) Foreign Application Priority Data

Oct. 30, 2012 (JP) ................. 2012-239342

(51) Int. Cl.
*G11C 16/04* (2006.01)
*G11C 5/08* (2006.01)
(Continued)

(52) U.S. Cl.
CPC .. *G11C 5/08* (2013.01); *G11C 7/14* (2013.01); *G11C 11/14* (2013.01); *G11C 11/15* (2013.01);
(Continued)

(58) Field of Classification Search
CPC .......... G11C 11/16; G11C 1/15; G11C 11/18; G11C 11/14; G11C 11/5607; G11C 11/15
USPC ................ 365/185.05, 185.2, 210.14, 230.07
See application file for complete search history.

(56) References Cited

U.S. PATENT DOCUMENTS 7,167,389 B2 * 1/2007 Iwata ..................... G11C 11/16
365/158
7,277,342 B2 * 10/2007 Sumitani .................. G11C 7/22
365/185.2

(Continued)

FOREIGN PATENT DOCUMENTS

JP 2004-234707 A 8/2004

OTHER PUBLICATIONS

Wataru Otsuka et al., "A 4Mb Conductive-Bridge Resistive Memory with 2.3GB/s Read-Throughput and 216MB/s Program-Throughout", 2011 IEEE International Solid-State Circuits Conference Digest of Technical Papers, pp. 210-211.
International Search Report issued in International Application No. PCT/JP2013/006400 with Date of mailing Nov. 26, 2013, with English Translation.

Primary Examiner — Pho M Luu
(74) Attorney, Agent, or Firm — McDermott Will & Emery LLP

(57) ABSTRACT

A memory array includes a resistive memory cell array having a first cell transistor and a resistance change element connected in series and a reference cell array having a second cell transistor and a resistance element connected in series. The second cell transistor of the reference cell array is connected to a reference source line, and the resistance element is connected to a reference bit line. A dummy memory cell is connected to the reference bit line in the memory cell array, and both ends of a resistance change element of the dummy memory cell are short-circuited through the reference bit line.

12 Claims, 10 Drawing Sheets

(51) Int. Cl.
*G11C 11/56* (2006.01)
*G11C 11/18* (2006.01)
*G11C 11/14* (2006.01)
*G11C 11/15* (2006.01)
*G11C 13/00* (2006.01)
*G11C 11/16* (2006.01)
*G11C 7/14* (2006.01)

(52) U.S. Cl.
CPC ............... *G11C 11/16* (2013.01); *G11C 11/18* (2013.01); *G11C 11/5607* (2013.01); *G11C 13/004* (2013.01); *G11C 13/0004* (2013.01); *G11C 2013/0054* (2013.01); *G11C 2213/79* (2013.01)

(56) References Cited

U.S. PATENT DOCUMENTS

| | | | |
|---|---|---|---|
| 7,742,340 B2 * | 6/2010 | Mu | G11C 7/14 365/185.2 |
| 8,179,739 B2 * | 5/2012 | Hanzawa | G11C 13/0004 365/100 |
| 8,406,072 B2 * | 3/2013 | Kim | G11C 29/24 365/189.07 |
| 2004/0114444 A1 | 6/2004 | Matsuoka | |
| 2005/0157541 A1 | 7/2005 | Iwata | |
| 2007/0247939 A1 | 10/2007 | Nahas et al. | |
| 2011/0211390 A1 | 9/2011 | Hanzawa et al. | |

* cited by examiner

| | READ | RESET (PROGRAM) | SET (ERASE) |
|---|---|---|---|
| WL | Vg_read | Vg_reset | Vg_set |
| BL | Vread | Vreset | VSS |
| SL | VSS | VSS | Vset |
| OPERATION | "0"/"1" READ | RESISTANCE INCREASED ("0" DATA) | RESISTANCE DECREASED ("1" DATA) |

NONVOLATILE SEMICONDUCTOR MEMORY DEVICE

CROSS-REFERENCE TO RELATED APPLICATIONS

This is a continuation of International Application No. PCT/JP2013/006400 filed on Oct. 29, 2013, which claims priority to Japanese Patent Application No. 2012-239342 filed on Oct. 30, 2012. The entire disclosures of these applications are incorporated by reference herein.

BACKGROUND

The present disclosure relates to nonvolatile semiconductor memory devices, and more particularly to layout configuration and circuit configuration for solving a mismatch in drive load capacitance between a memory cell array and a reference cell array.

In recent years, with increase in demand for electronic equipment such as cellular phones (smartphones), portable music players, digital cameras, and tablet terminals, in particular, demand for nonvolatile semiconductor memory devices has been growing. Technical development has therefore been made actively for achieving increase in capacity, size reduction, high-speed rewrite, high-speed read, and low-power operation.

Currently main nonvolatile memory is flash memory. The rewrite time of flash memory is however in the order of microseconds or milliseconds, and this has become a cause of blocking improvement of the performance of set equipment incorporating nonvolatile memory.

Recently, novel nonvolatile memory devices capable of high-speed, low-power rewrite, in comparison with flash memory, have been under active development. An example of such memory devices includes resistive random access memory (ReRAM) using resistance change elements as memory elements. ReRAM is capable of high-speed rewrite having a rewrite time as high as the nanosecond order. Moreover, while a voltage of 10V or more is required at the rewrite time for flash memory, ReRAM can perform rewrite only with about 1.8 V, permitting reduction in the power consumption of nonvolatile memory.

Read circuit configurations of ReRAM are disclosed in Japanese Unexamined Patent Publication No. 2004-234707 and "A 4 Mb Conductive-Bridge Resistive Memory with 2.3 GB/s Read-Throughput and 216 MB/s Program Throughput," 2011 IEEE International Solid-State Circuits Conference Digest of Technical Papers, P210-211. Memory cells of ReRAM are each comprised of a resistance change element and a cell transistor connected in series. The resistance change element stores data by being set to a low resistance value or a high resistance value in a resistance value range of 1 KΩ to 1 MΩ, for example, according to the stored data ("0" data, "1" data). The memory cell current is large when the resistance value of the resistance change element is low, and is small when it is high. The difference in this memory cell current is detected by a sense amplifier circuit during read operation, thereby reading the data stored in the memory cell.

In order to determine the magnitude of the memory cell current by the sense amplifier circuit, a reference cell for generating a reference current is used. The sense amplifier circuit determines the data stored in the memory cell by comparing the memory cell current with the reference cell current. The reference cell is comprised of a fixed resistance element formed of a polysilicon resistance element, for example, and a cell transistor connected in series. The resistance value of the fixed resistance element of the reference cell is set to the intermediate value between the low resistance value and the high resistance value set for the resistance change element of the memory cell. By this setting, the reference cell current during read operation is a current value intermediate between the memory cell currents corresponding to "0" data and "1" data, and thus the sense amplifier circuit can determine the data stored in the memory cell.

The memory cell and the sense amplifier are connected through a bit line, and the reference cell and the sense amplifier are connected through a reference bit line. In order to read data by comparing the cell current with the reference cell current, it is necessary to match the load resistance of the bit line with that of the reference bit line. For this, first, the wiring widths and lengths of the bit line and the reference bit line must be the same. However, since a number of memory cells are connected to the bit line while only a reference cell is connected to the reference bit line, only achieving the same wiring width and length will still generate a large deviation in load resistance. To solve this problem, generally used is a method of connecting dummy memory cells to the reference bit line to match the load resistance of the reference bit line with that of the bit line. For efficient layout, such dummy memory cells for the reference bit line are generally arranged in the memory cell array. In this case, resistance change elements are also provided in the dummy memory cells to secure the pattern uniformity in the memory cell array.

Also, in ReRAM, etc. an operation called forming is first required to make the resistance change element switchable between the high resistance state and the low resistance state. In the forming, a voltage higher than that for normal rewrite is applied to the resistance change element. By this application, the resistance change element that is in an ultra-high resistance state before the forming is rendered switchable between the high resistance state and the low resistance state.

SUMMARY

The above-described conventional resistive nonvolatile memory has the following problem. In high-speed read for nonvolatile memory such as ReRAM, since it takes time if the cell current is compared with the reference cell current by the sense amplifier after the currents have become saturated to their fixed values, the sense amplifier compares the currents in their transient states before being saturated to the fixed values. To perform read in the transient states, it is necessary to match the drive load capacitance of the bit line with that of the reference bit line.

Meanwhile, in the case of arranging dummy memory cells for the reference bit line in the memory cell array, the dummy memory cells cannot be subjected to the forming. If configured so that the forming can be performed, such a dummy memory cell will also be selected simultaneously during memory cell selection, causing a current to flow, not only to the reference cell, but also to the dummy memory cell and thus failing to control the reference cell current correctly. Therefore, while the memory cells are subjected to the forming to render their resistance change elements switchable between the high resistance state and the low resistance state, the dummy memory cells cannot be subjected to the forming leaving their resistance change elements in the ultra-high resistance state. For this reason, the resistance values of the resistance change elements become largely different between the memory cells and the dummy memory cells. With the resistance change element of each dummy memory cell being in the ultra-high resistance state, the drive load capacitances of via contacts, etc. lying farther than the resistance change element become hard to be reflected on the reference bit line. As a result, a mismatch occurs in drive load capacitance between the reference bit line and the bit lines of the memory cells.

When a mismatch occurs in drive load capacitance, the way of change of the current in the transient state differs between the cell current and the reference cell current during high-speed read, and this makes it difficult to perform high-speed read. When the read speed becomes low, the time during which the cell current and the reference cell current are allowed to flow becomes long, increasing the current consumption during read.

In view of the above-described problem, an objective of the present disclosure is providing a nonvolatile semiconductor memory device where a mismatch in drive load capacitance between the bit line for the reference cell and the bit line for the memory cell is reduced.

According to an embodiment of the present disclosure, a nonvolatile semiconductor memory device includes: a word line; a first data line; a second data line; a plurality of memory cells each having a first cell transistor and a first resistance change element connected in series between the first data line and the second data line, a gate of the first cell transistor being connected to the word line; a reference word line; a first reference data line; a second reference data line; a reference cell having a second cell transistor and a resistance element connected in series between the first reference data line and the second reference data line, a gate of the second cell transistor being connected to the reference word line; and a dummy memory cell having a third cell transistor and a second resistance change element, wherein in the dummy memory cell, both ends of the second resistance change element are connected to the first reference data line, and one end of the third cell transistor is connected to one end of the second resistance change element, the other end thereof is open, and a gate thereof is connected to the word line.

With the above configuration, in the dummy memory cell, both ends of the resistance change element are short-circuited through the first reference data line. Therefore, the drive load capacitances of via contacts and interconnects lying between the resistance change element and the cell transistor can be reflected on the first reference data line. Thus, the drive load capacitance of the first reference data line can be made closer to the drive load capacitance of the first data line of the memory cell.

According to another embodiment of the present disclosure, a nonvolatile semiconductor memory device includes: a word line; a first data line; a second data line; a plurality of memory cells each having a first cell transistor and a first resistance change element connected in series between the first data line and the second data line, a gate of the first cell transistor being connected to the word line; a reference word line; a first reference data line; a second reference data line; a reference cell having a second cell transistor and a resistance element connected in series between the first reference data line and the second reference data line, a gate of the second cell transistor being connected to the reference word line; and a dummy memory cell having a third cell transistor, wherein, in the dummy memory cell, one end of the third cell transistor is connected to the first reference data line, the other end thereof is open, and a gate thereof is connected to the word line.

With the above configuration, the dummy memory cell has no resistance change element, and one end of the cell transistor thereof is connected to the first reference data line. Therefore, the drive load capacitances of via contacts and interconnects connected to the cell transistor can be reflected on the first reference data line. Thus, the drive load capacitance of the first reference data line can be made closer to the drive load capacitance of the first data line of the memory cell.

According to the nonvolatile semiconductor memory device of the present disclosure, a mismatch in drive load capacitance between the reference data line and the data line for the memory cell can be reduced, and thus the read precision at high-speed read can be enhanced.

DETAILED DESCRIPTION

Embodiments of the present disclosure will be described hereinafter with reference to the accompanying drawings.

First Embodiment

Figure 1:
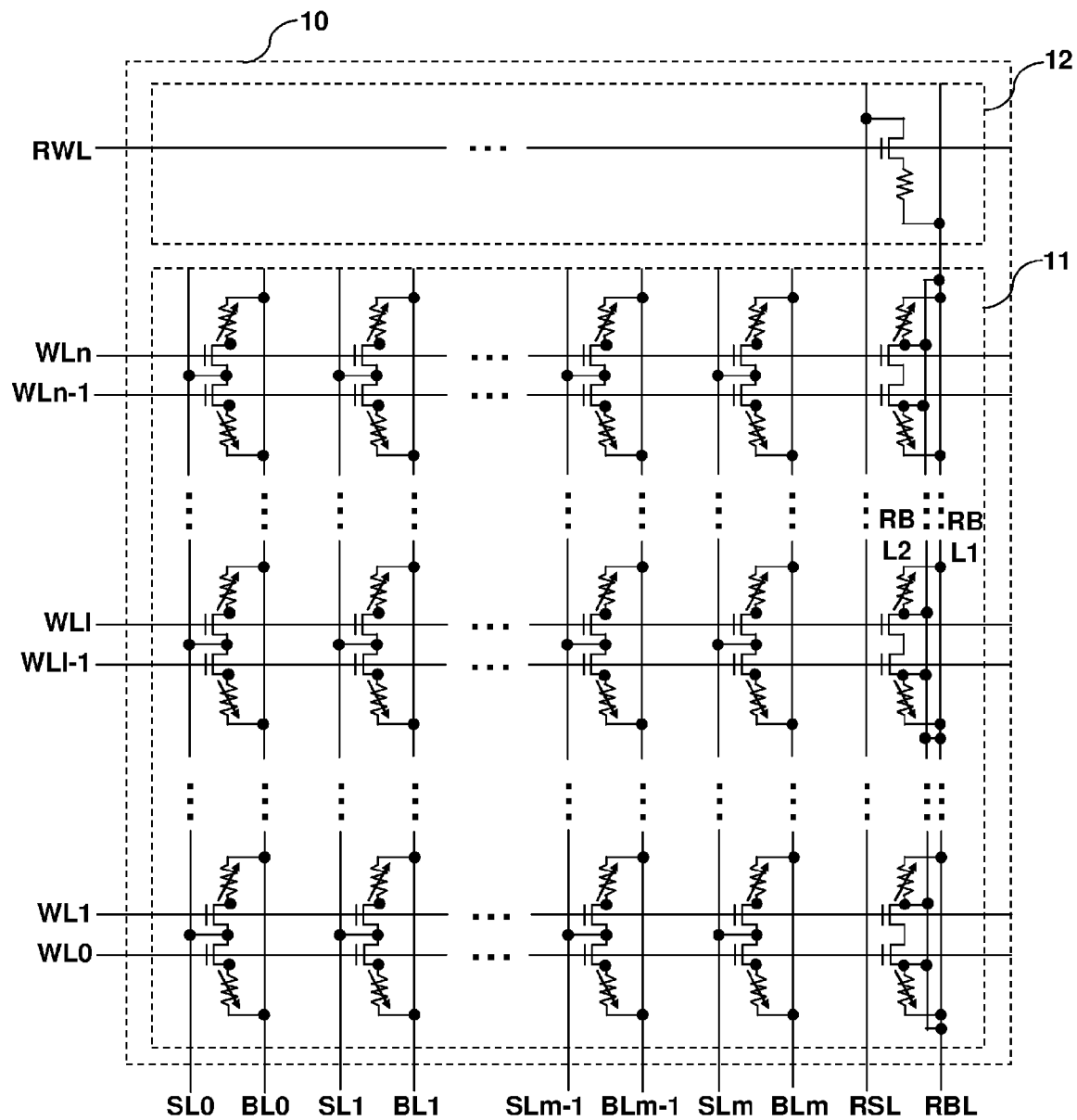
FIG. 1 is a view showing a detailed configuration of a memory array of a nonvolatile semiconductor memory device according to the first embodiment.

FIG. 1 is a view showing a detailed configuration of a memory array of a nonvolatile semiconductor memory device according to the first embodiment. FIG. 1 particularly shows a detailed configuration of dummy memory cells for a reference bit line, which is a feature of this embodiment, and detailed description on this will be made after description of the entire configuration of the nonvolatile semiconductor memory device.

Figure 2:
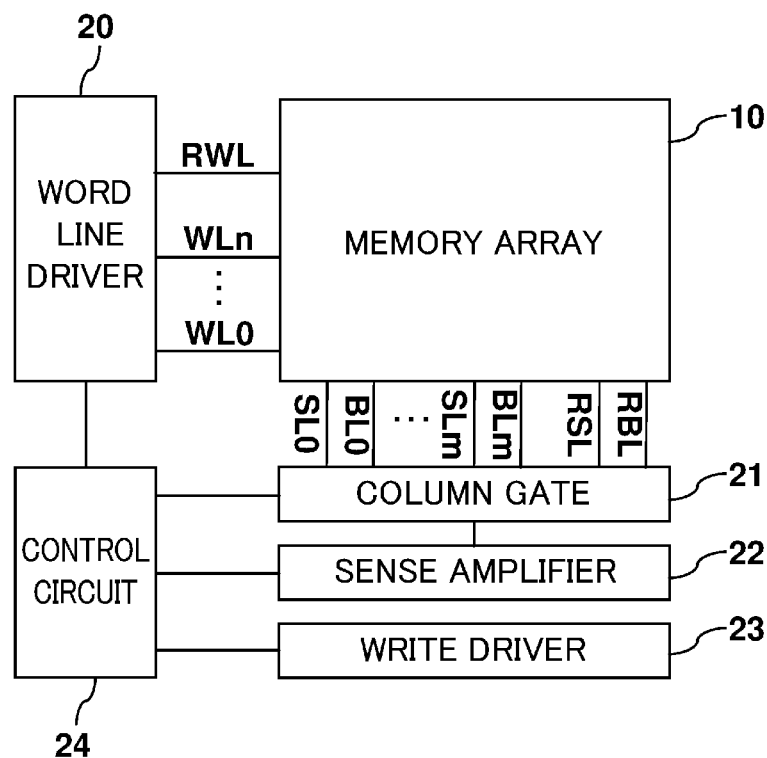
FIG. 2 is a view showing an entire configuration of the nonvolatile semiconductor memory device according to the first embodiment.

FIG. 2 is a view showing an entire configuration of the nonvolatile semiconductor memory device according to the first embodiment. The nonvolatile semiconductor memory device includes a memory array 10, a word line driver 20, a column gate 21, a sense amplifier 22, a write driver 23, and a control circuit 24.

In the memory array 10, memory cells that store data and a reference cell that generates a reference cell current during read operation are arranged. To the memory array 10, connected are word lines WL0 to WLn, bit lines BL0 to BLm, and source lines SL0 to SLm, which are connected to the memory cells, and a reference word line RWL, a reference bit line RBL, and a reference source line RSL, which are connected to the reference cell. Details of the memory array 10 will be described later.

The word line driver 20 is a circuit that selects/drives the word lines WL0 to WLn and the reference word line RWL in the memory array 10 in response to a received input address (not shown in FIG. 2).

The column gate 21 is a circuit that selects the bit lines BL0 to BLm, the source lines SL0 to SLm, the reference bit line RBL, and the reference source line RSL in the memory array 10 in response to a received input address (not shown in FIG. 2), and connects the selected lines to the sense amplifier 22 and the write driver 23 to be described below.

The sense amplifier 22 is a circuit that determines data stored in the memory cells of the memory array 10 during read operation. The read operation is performed by selecting/connecting the bit lines BL0 to BLm connected to the memory cells and the reference bit line RBL connected to the reference cell via the column gate 21.

The write driver 23 is a circuit that applies a rewrite voltage to the memory array 10 during rewrite operation. More specifically, the write driver 23 selects the bit lines or the source lines to apply a positive voltage when rewrite operation is performed or apply a ground voltage VSS (0 V) when no rewrite operation is performed. The voltage supplied from the write driver 23 is applied to the selected bit lines BL0 to BLm or source lines SL0 to SLm via the column gate 21.

The control circuit 24 is a circuit that controls various operation modes, such as read and rewrite, of the nonvolatile semiconductor memory device, and controls the word line driver 20, the column gate 21, the sense amplifier 22, and the write driver 23.

Figure 3:
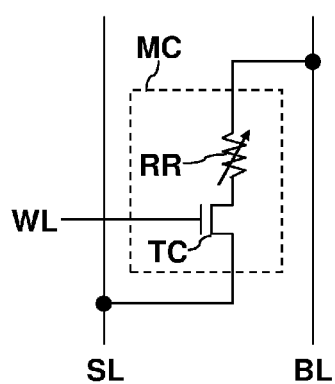
FIG. 3 is a circuit diagram of a memory cell of the nonvolatile semiconductor memory device according to the first embodiment.

FIG. 3 is a view showing a circuit diagram of a memory cell of the nonvolatile semiconductor memory device according to the first embodiment. In this embodiment, a memory cell of resistive memory (ReRAM) will be described as an example. A memory cell MC is comprised of a resistance change element (RR) and a cell transistor (TC) connected in series, where a word line WL is connected to the gate terminal of the cell transistor TC, a bit line BL is connected to one end of the resistance change element RR, and a source line SL is connected to one end of the cell transistor. It should be noted that, although a configuration where the resistance change element RR is connected to the bit line and the cell transistor TC is connected to the source line SL is described as an example in this embodiment, this embodiment is also applicable to a memory cell where the cell transistor TC is connected to the bit line BL and the resistance change element RR is connected to the source line. The memory cell of the nonvolatile semiconductor memory device of this embodiment is a "1T1R" resistive memory cell comprised of one cell transistor and one resistance change element RR.

Figures 4, 5:
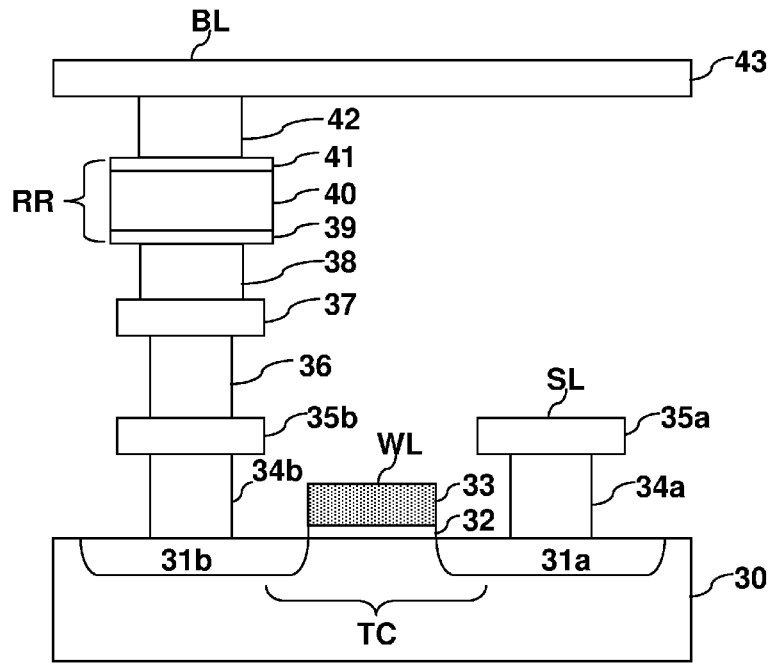
FIG. 4 is a cross-sectional view of the memory cell of the nonvolatile semiconductor memory device according to the first embodiment.
FIG. 5 is a view showing voltage values applied to memory cells in various operation modes of the nonvolatile semiconductor memory device according to the first embodiment.

FIG. 4 is a view showing a cross-sectional view of a memory cell of the nonvolatile semiconductor memory device according to the first embodiment. Diffusion regions 31a and 31b are formed on a semiconductor substrate 30 and function as the source terminal and the drain terminal, respectively, of the cell transistor TC. The region between the diffusion regions 31a and 31b functions as the channel region of the cell transistor TC. On the channel region, formed are an oxide film 32 and a gate electrode 33 (the word line WL) made of polysilicon, thereby functioning as the cell transistor TC.

The source terminal 31a of the cell transistor TC is connected via a via contact 34a to the source line SL that is a first wiring layer 35a. The drain terminal 31b of the cell transistor TC is connected to a first wiring layer 35b via a via contact 34b. The first wiring layer 35b is connected to a second wiring layer 37 via a via contact 36, and the second wiring layer 37 is connected to the resistance change element RR via a via contact 38. The resistance change element RR is comprised of a lower electrode 39, a resistance change layer 40, and an upper electrode 41. The resistance change element RR is connected via a via contact 42 to the bit line BL that is a third wiring layer 43.

FIG. 5 is a view showing voltage values applied to the memory cell in various operation modes of the nonvolatile semiconductor memory device according to the first embodiment. In FIG. 5, during read operation, a gate voltage Vg_read (e.g., 1.8 V) is applied to the word line WL to put the cell transistor TC in the selected state, a drain voltage Vread (e.g., 0.4 V) is applied to the bit line BL, and the ground voltage VSS (0 V) is applied to the source line SL. With this voltage application, the memory cell current becomes small when the resistance change element RR is in the high resistance state (reset or program state) or becomes large when it is in the low resistance state (set or erase state). The sense amplifier determines the difference in current value, thereby determining the data stored in the memory cell.

In FIG. 5, during reset operation (program operation), a gate voltage Vg_reset (e.g., 2.4 V) is applied to the word line WL to put the cell transistor TC in the selected state, a drain voltage Vreset (e.g., 2.4 V) is applied to the bit line BL, and the ground voltage VSS (0 V) is applied to the source line SL. With this voltage application, a positive voltage is applied to the upper electrode of the resistance change element RR, changing the element to the high resistance state ("0" data). During set operation (erase operation), a gate voltage Vg_set (e.g., 2.4 V) is applied to the word line WL to put the cell transistor TC in the selected state, the ground voltage VSS (0 V) is applied to the bit line BL, and a source voltage Vset (e.g., 2.4 V) is applied to the source line SL. With this voltage application, a positive voltage is applied to the lower electrode of the resistance change element RR, changing the element to the low resistance state ("1" data).

Referring back to FIG. 1, the detailed configuration of the memory array of the nonvolatile semiconductor memory device according to this embodiment will be described. The memory array 10 is comprised of a memory cell array 11 having the above-described memory cells MC arranged in a matrix in the row and column directions and a reference cell array 12 that generates a reference cell current during read operation.

The memory cell array 11 includes the word lines WL0 to WLn, the bit lines BL0 to BLm, and the source lines SL0 to SLm, where, as described above, the word lines WL0 to WLn are connected to the gates of the cell transistors, the bit lines BL0 to BLm are connected to ends of the resistance change elements, and the source lines SL0 to SLm are connected to ends of the cell transistors. In other words, the memory cell array 11 is comprised of (n+1)×(m+1) memory cells. The memory cell array 11 also includes the reference bit line RBL and the reference source line SRL that generate/supply the reference cell current during read operation, and dummy memory cells (memory cells that store no data) are connected to the reference bit line RBL in the memory cell array 11.

The reference cell array 12 includes the reference word line RWL, the reference bit line RBL, and the reference source line RSL, where the reference word line RWL is connected to the gate of the cell transistor, the reference bit line RBL is connected to one end of the fixed resistance element, and the reference source line RSL is connected to one end of the cell transistor. Note that, although the reference cell array is shown to have only one reference cell comprised of the cell transistor and the fixed resistance element, a plurality of reference cells may be provided.

In the memory cell array 11, the reference bit line RBL is comprised of two interconnects RBL1 and RBL2, which are connected to each other every plural word lines. In FIG. 1, the interconnects RBL1 and RBL2 are connected at the top and bottom ends of the memory cell array and near the word line WLl-1, as an example. In the dummy memory cells, one end of the resistance change element is connected to the interconnect RBL1, and the other end thereof is connected to the cell transistor and the interconnect RBL2. That is, in the dummy memory cells, both ends of the resistance change element are short-circuited through the reference bit line RBL (RBL1 and RBL2). The other end of the cell transistor is open.

The dummy memory cells use the same word lines WL0 to WLn as the memory cells do. Therefore, when a voltage is applied to one word line selected from the word lines WL0 to WLn during memory access, the voltage is also applied to the gate of the cell transistor of the relevant dummy memory cell, turning on the cell transistor. In order to prevent short-circuiting between the reference bit line RBL and the reference source line RSL at this time, the cell transistor of the dummy memory cell is not connected to the reference source line RSL, unlike the cell transistors of the memory cells. Also, since the dummy memory cell is not connected to the reference source line RSL and both ends of the resistance change element RR are short-circuited, the forming of the resistance change element RR cannot be performed.

Figure 6:
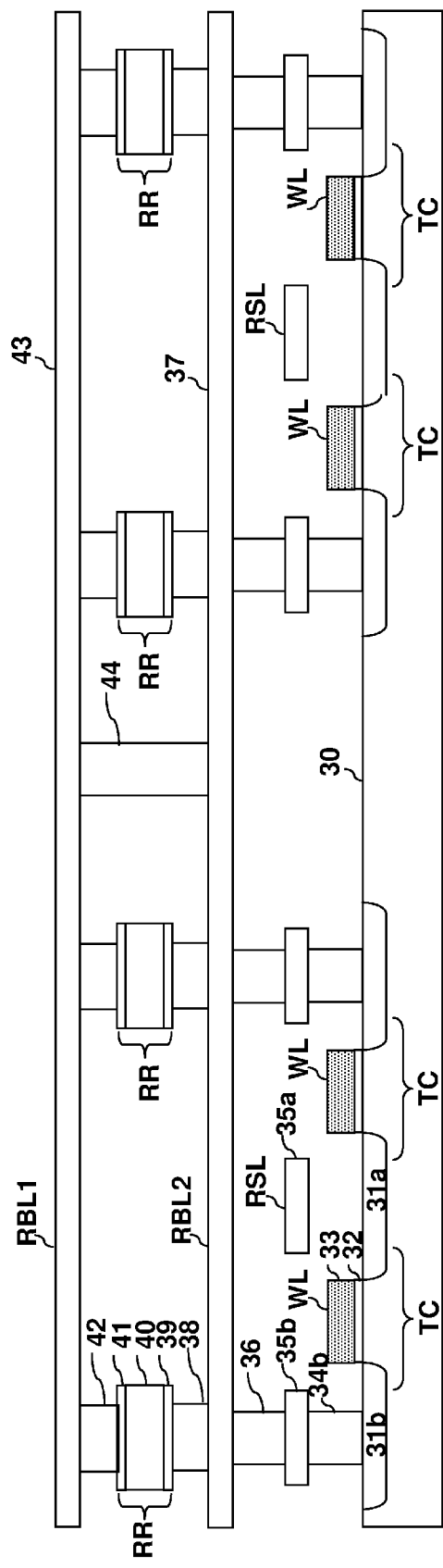
FIG. 6 is a cross-sectional view of dummy memory cells of the nonvolatile semiconductor memory device according to the first embodiment.

FIG. 6 is a cross-sectional view of dummy memory cells of the nonvolatile semiconductor memory device according to the first embodiment, showing a portion corresponding to four dummy memory cells. The dummy memory cells in FIG. 6 have a three-layer wiring structure, and the resistance change element RR and the cell transistor TC are the same as those in FIG. 4: the resistance change element RR is formed between the second wiring layer and the third wiring layer. A difference from FIG. 4 is that not only the third wiring layer but also the second wiring layer are used for wiring of the bit lines. In FIG. 6, the first wiring layer is used for wiring of the reference source line RSL, the second wiring layer for wiring of the reference bit line RBL2, and the third wiring layer for wiring of the reference bit line RBL1. The reference bit line RBL2 in the second wiring layer runs in parallel with the reference bit line RBL1 in the third wiring layer, and the reference bit lines RBL2 and RBL1 are connected to each other every plural word lines via a second-third wiring layer connecting via contact 44. As a result, both ends of the resistance change element RR are short-circuited through the reference bit lines RBL1 and RBL2. Thus, it is possible to reflect the drive load capacitances of the first-second wiring layer connecting via contact 36, the first wiring layer 35b, the diffusion-first wiring layer connecting via contact 34b, and the diffusion layer 31b lying between the resistance change element RR and the cell transistor TC of the dummy memory cell on the reference bit line RBL. In this case, however, an area where to place the second-third wiring layer connecting via contact 44 becomes necessary every plural word lines, in addition to the dummy memory cells.

Since both ends of the resistance change elements RR of the dummy memory cells are short-circuited and the dummy memory cells are in the ultra-high resistance state with no forming being performed, absence of the resistance change elements RR will not largely affect the circuit operation. Nevertheless, such resistance change elements RR are left unremoved for the reason of securing the uniformity of the pattern of the resistance change elements RR in the memory cell array 11. If the resistance change elements RR are not present only in the portion of the reference bit line RBL while they are present in the memory cells at fixed intervals, the pattern uniformity will be lost only in the portion of the reference bit line RBL, lowering the characteristics of the surrounding memory cells. To prevent this, the resistance change elements RR are provided also for the reference bit line RBL.

Figure 7:
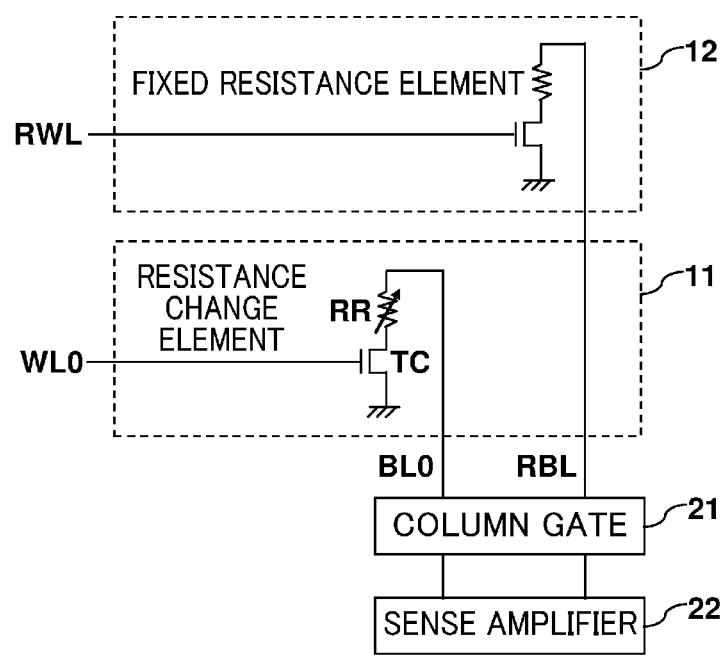
FIG. 7 is a view showing circuit connections of a selected memory cell and a selected reference cell during read operation of the nonvolatile semiconductor memory device according to the first embodiment.

FIG. 7 is a view showing circuit connections of the selected memory cell and the selected reference cell during read operation of the nonvolatile semiconductor memory device according to the first embodiment. FIG. 7 shows a case of selecting the memory cell connected to the word line WL0 and the bit line BL0 in the memory cell array 11 and selecting the reference cell connected to the reference word line RWL in the reference cell array 12. Since the source line SL0 and the reference source line RSL are set to the ground voltage VSS (0 V) during read operation, they are shown as the ground voltage VSS (0 V) in FIG. 7.

The bit line BL0 and the reference bit line RBL are connected to the sense amplifier 22 via the column gate 21. By selecting the word line WL0 and the reference word line RWL and applying a drain voltage (e.g., 0.4 V) to the bit line BL0 and the reference bit line RBL, a memory cell current and a reference cell current corresponding to the resistance values of the resistance change element RR and the fixed resistance element flow to the memory cell and the reference cell, respectively. When the memory cell current is smaller than the reference cell current, i.e., when the resistance value of the resistance change element RR is high, the sense amplifier 22 outputs "0" data. When the memory cell current is larger than the reference cell current, i.e., when the resistance value of the resistance change element RR is low, the sense amplifier 22 outputs "1" data. In this way, read operation is performed. Since the drive load capacitance has been matched between the bit line and the reference bit line, data can be read normally even in the transient state before the cell current and the reference cell current are saturated to their fixed values. Therefore, the read speed can be increased, and furthermore, since the time during which the cell current and the reference current are allowed to flow can be shortened by this increase in speed, the power consumption during read operation can be reduced.

In other words, conventionally, while the resistance change element of each dummy memory cell for the reference bit line is connected to the reference bit line at one end and to the cell transistor at the other end, both ends of the resistance change element are not short-circuited through the reference bit line. In contrast, in this embodiment, while the resistance change element of each dummy memory cell is connected to the reference bit line at one end and to the cell transistor at the other end as in the conventional case, both ends of the resistance change element are short-circuited through the reference bit line. Therefore, it is possible to reflect the drive load capacitances of the via contacts and the interconnects lying between the resistance change element and the cell transistor on the reference bit line. In this way, the drive load capacitance of the reference bit line can be made closer to the drive load capacitance of each bit line for the memory cells.

Second Embodiment

Figure 8:
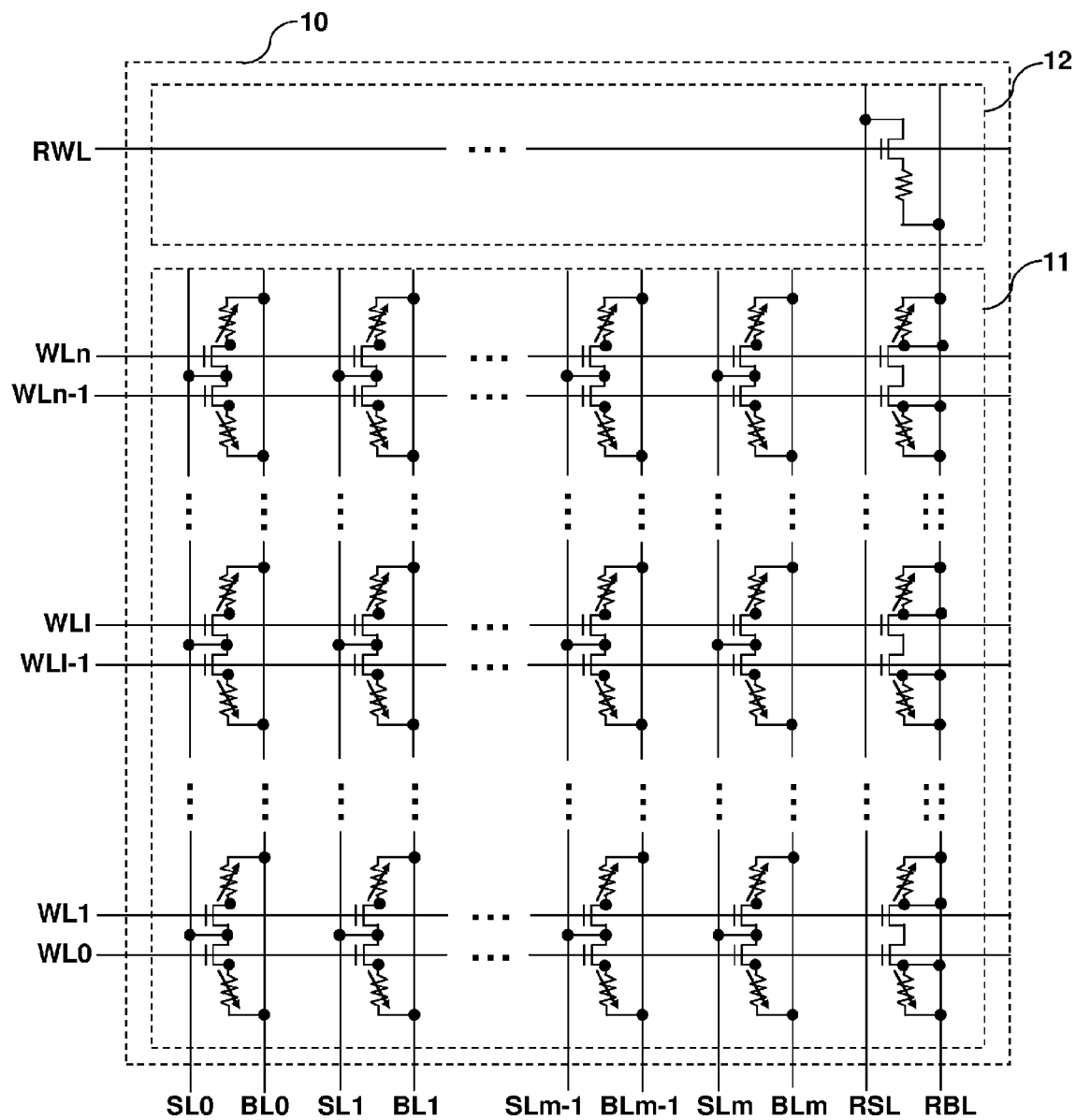
FIG. 8 is a view showing a detailed configuration of a memory array of a nonvolatile semiconductor memory device according to the second embodiment.

The nonvolatile semiconductor memory device according to the second embodiment is similar to that of the first embodiment in the surroundings of the array circuits, but is different therefrom in the configuration of the dummy memory cells for the reference bit line RBL. FIG. 8 is a view showing a detailed configuration of the memory array 10 in FIG. 2 according to the second embodiment. The configuration in FIG. 8 is substantially similar to that in FIG. 1, and thus duplicate description on substantially the same components may be omitted in some cases. The difference from FIG. 1 is the layout of the dummy memory cells for the reference bit line, and the circuit diagram is changed according to this difference.

Figure 9:
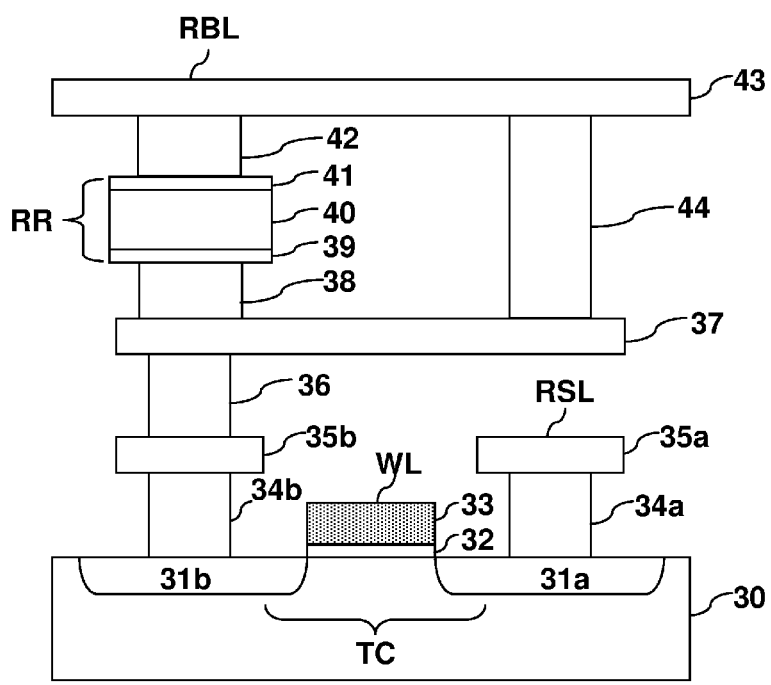
FIG. 9 is a cross-sectional view of a dummy memory cell of the nonvolatile semiconductor memory device according to the second embodiment.

FIG. 9 is a cross-sectional view of a dummy memory cell of the nonvolatile semiconductor memory device according to the second embodiment, showing a portion corresponding to one dummy memory cell. Duplicate description on substantially the same components as those in FIG. 6 may be omitted in some cases. In the second embodiment, a second-third wiring layer connecting via contact 44 is placed for each dummy memory cell to connect the second and third wiring layers. With this configuration, also, both ends of the resistance change element of the dummy memory cell can be short-circuited through the reference bit line RBL. Thus, it is possible to reflect the drive load capacitances of the first-second wiring layer connecting via contact 36, the first wiring layer 35b, the diffusion-first wiring layer connecting via contact 34b, and the diffusion layer 31b lying between the resistance change element RR and the cell transistor TC of the dummy memory cell on the reference bit line RBL.

With the above configuration, where the second-third wiring layer connecting via contact 44 is placed for each dummy memory cell, a mismatch in drive load capacitance between the bit line and the reference bit line can be more reduced than in the case of the first embodiment. Moreover, unlike the first embodiment, it is unnecessary to secure an area for connecting the second-layer interconnect and the third-layer interconnect separately, except for the dummy memory cells. Note however that the area of each dummy memory cell may possibly increase because the second-third wiring layer connecting via contact 44 is placed for each dummy memory cell. As in the first embodiment, the resistance change element RR of the dummy memory cell is left unremoved for the reason of securing the pattern uniformity of the memory cell array 11 although absence thereof will not largely affect the circuit operation.

Third Embodiment

Figure 10:
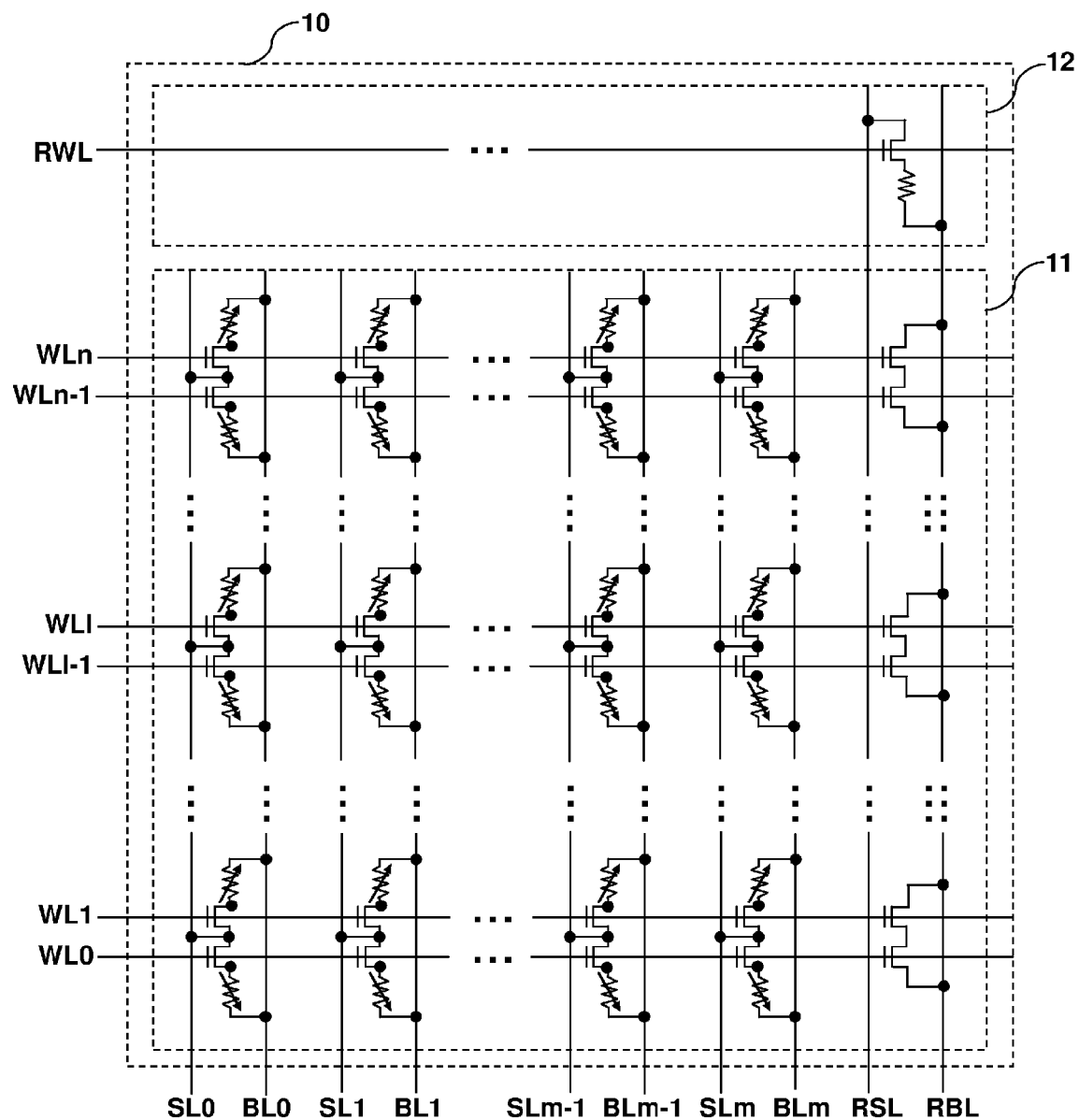
FIG. 10 is a view showing a detailed configuration of a memory array of a nonvolatile semiconductor memory device according to the third embodiment.

The nonvolatile semiconductor memory device according to the third embodiment is similar to that of the first embodiment in the surroundings of the array circuits, but is different therefrom in the configuration of the dummy memory cells for the reference bit line RBL. FIG. 10 is a view showing a detailed configuration of the memory array 10 in FIG. 2 according to the third embodiment. The configuration in FIG. 10 is substantially similar to that in FIG. 1, and thus duplicate description on substantially the same components may be omitted in some cases. The difference from FIG. 1 is that no resistance change element is used in the dummy memory cells for the reference bit line. That is, in each dummy memory cell, the cell transistor is connected to the reference bit line at one end and open at the other end.

Figure 11:
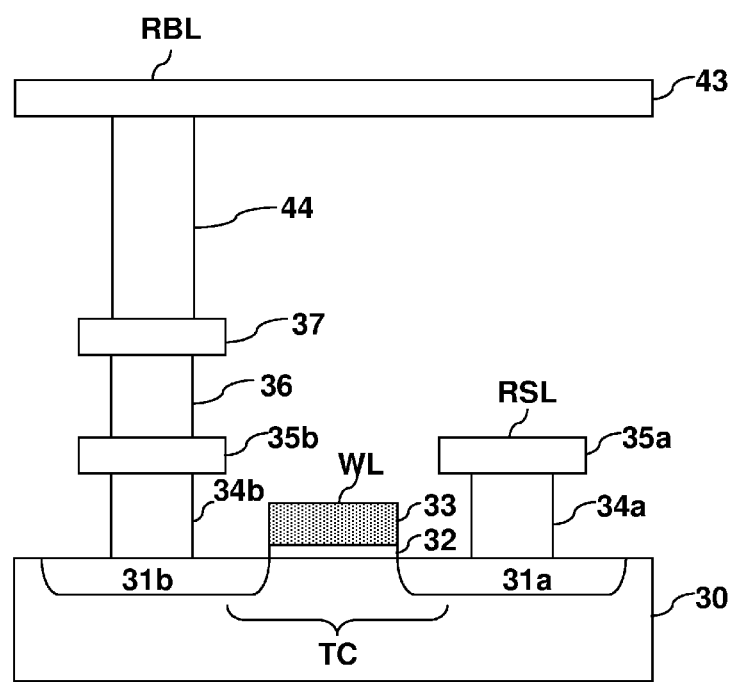
FIG. 11 is a cross-sectional view of a dummy memory cell of the nonvolatile semiconductor memory device according to the third embodiment.

FIG. 11 is a cross-sectional view of a dummy memory cell of the nonvolatile semiconductor memory device according to the third embodiment, showing a portion corresponding to one dummy memory cell. Duplicate description on substantially the same components as those in FIG. 6 may be omitted in some cases. In the third embodiment, no resistance change element is placed in the dummy memory cell, and, instead, a second-third wiring layer connecting via contact 44 is placed. With this configuration, also, it is possible to reflect the drive load capacitances of the first-second wiring layer connecting via contact 36, the first wiring layer 35b, the diffusion-first wiring layer connecting via contact 34b, and the diffusion layer 31b on the reference bit line RBL.

With the above configuration, where the second-third wiring layer connecting via contact 44 is placed for each dummy memory cell, a mismatch in drive load capacitance between the bit line and the reference bit line can be more reduced than in the case of the first embodiment. Moreover, unlike the first embodiment, it is unnecessary to secure an area for connecting the second-layer interconnect and the third-layer interconnect separately, except for the dummy memory cells. It is preferable to make the pattern uniform in the memory cell array to ensure uniformity of the characteristics of the memory cells. While the pattern can be made uniform with placement of resistance change elements also in the dummy memory cells, the influence of absence of resistance change elements for the reference bit line is small as long as the reference bit line is placed at an end of the memory cell array.

Fourth Embodiment

Figure 12:
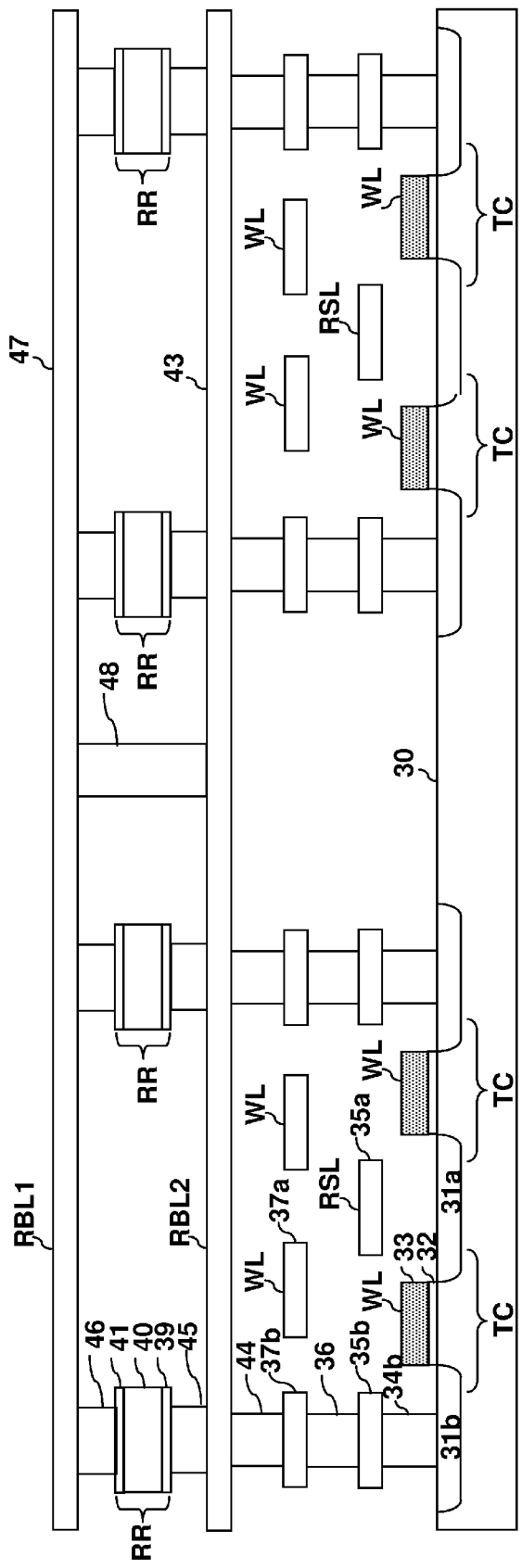
FIG. 12 is a cross-sectional view of dummy memory cells of a nonvolatile semiconductor memory device according to the fourth embodiment.

The nonvolatile semiconductor memory device according to the fourth embodiment is similar to that of the first embodiment in the surroundings of the array circuits, but is different therefrom in the layout configuration of the dummy memory cells for the reference bit line RBL. FIG. 12 is a cross-sectional view of a dummy memory cell of the nonvolatile semiconductor memory device according to the fourth embodiment, showing a portion corresponding to four dummy memory cells. Duplicate description on substantially the same components as those in FIG. 6 may be omitted in some cases.

In the fourth embodiment, the wiring layers are of a four-layer structure, where the first wiring layer is used for wiring of the reference source line RSL, the third wiring layer for wiring of the reference bit line RBL2, and the fourth wiring layer for wiring of the reference bit line RBL1. The resistance change elements RR are present between the third wiring layer and the fourth wiring layer. Each resistance change element RR is connected to the reference bit line RBL2 in the third wiring layer via a via contact 45 and connected to the reference bit line RBL1 in the fourth wiring layer via a via contact 46. The reference bit lines RBL2 and RBL1 are connected to each other every plural word lines via a third-fourth wiring layer connecting via contact 48. Also, since the wiring resistance of each word line is large when the word line is made of only the gate interconnect, the word line is backed using the second wiring layer. The backing interconnect in the second wiring layer and the gate interconnect are connected to each other every plural bit lines. With this configuration, also, both ends of the resistance change element of each dummy memory cell can be short-circuited through the reference bit lines RBL1 and RBL2. It is therefore possible to reflect the drive load capacitances of the second-third wiring layer connecting via contact 44, the second wiring layer 37b, the first-second wiring layer connecting via contact 36, the first wiring layer 35b, the diffusion-first wiring layer connecting via contact 34b, and the diffusion layer 31b lying between the resistance change element RR and the cell transistor TC of the dummy memory cell on the reference bit line RBL. In particular, in the four-layer wiring, this effect is great because the drive load capacitance between the resistance change element RR and the cell transistor TC of the dummy memory cell is large, compared with the case of the three-layer wiring.

In the above configuration, also, like the first embodiment, the resistance change elements RR of the dummy cells are left unremoved for the reason of securing the pattern uniformity of the memory cell array 11 although absence thereof will not largely affect the circuit operation.

In the above embodiments, it is preferable that the gate oxide film thickness be the same among the cell transistors of the memory cells, the cell transistor of the reference cell, and the cell transistors of the dummy memory cells, although there will be no problem if the gate oxide film thickness is different among them. It is also preferable that the gate channel length and the gate channel width be the same among the cell transistors of the memory cells, the cell transistor of the reference cell, and the cell transistors of the dummy memory cells, although there will be no problem if the gate channel length and width are different among them.

While preferred embodiments have been described, the nonvolatile semiconductor memory device according to the present disclosure is not limited to these embodiments, but various changes, etc. may be made without departing from the spirit of the disclosure. For example, while the nonvolatile semiconductor memory devices of the above embodiments have been described as having a configuration where, in the resistive memory cell having a resistance change element and a cell transistor connected in series, a bit line is connected to the resistance change element side and a source line is connected to the cell transistor side, the disclosure is also applicable to a nonvolatile semiconductor memory device having a configuration where a bit line is connected to the cell transistor side and a source line is connected to the resistance change element side.

Also, while the nonvolatile semiconductor memory devices of the above embodiments have been described as being resistive nonvolatile memory (ReRAM) as an example, the disclosure is also applicable to other nonvolatile semiconductor memory devices such as magnetoresistive nonvolatile memory (MRAM) where the resistance change element is formed of a magnetoresistance change element and phase change nonvolatile memory (PRAM) where the resistance change element is formed of a phase change element.

According to the present disclosure, the read precision at high-speed read can be improved in a nonvolatile semiconductor memory device. The disclosure is therefore useful for speedup of the operation of resistive nonvolatile semiconductor memory devices, etc.

What is claimed is:

1. A nonvolatile semiconductor memory device, comprising:
    a word line;
    a first data line;
    a second data line;
    a plurality of memory cells each having a first cell transistor and a first resistance change element connected in series between the first data line and the second data line, a gate of the first cell transistor being connected to the word line;
    a reference word line;
    a first reference data line;
    a second reference data line;
    a reference cell having a second cell transistor and a resistance element connected in series between the first reference data line and the second reference data line, a gate of the second cell transistor being connected to the reference word line; and
    a dummy memory cell having a third cell transistor and a second resistance change element,
wherein
    in the dummy memory cell, both ends of the second resistance change element are connected to the first reference data line, and one end of the third cell transistor is connected to one end of the second resistance change element.

2. The nonvolatile semiconductor memory device of claim 1, wherein one end of the third cell transistor that is not connected to the first reference data line is open, and a gate of the third cell transistor is connected to the word line.

3. The nonvolatile semiconductor memory device of claim 1, wherein the first cell transistor, the second cell transistor, and the third cell transistor have the same gate oxide film thickness.

4. The nonvolatile semiconductor memory device of claim 1, wherein the first cell transistor, the second cell transistor, and the third cell transistor have the same gate channel length and gate channel width.

5. The nonvolatile semiconductor memory device of claim 1, further comprising:
    a sense amplifier that determines data stored in the plurality of memory cells; and
    a column gate that selects the first data line and the first reference data line and connects the selected lines to the sense amplifier.

6. The nonvolatile semiconductor memory device of claim 1, further comprising:
    a sense amplifier that determines data stored in the plurality of memory cells; and
    a column gate that selects the second data line and the second reference data line and connects the selected lines to the sense amplifier.

7. The nonvolatile semiconductor memory device of claim 1, wherein at least one of the first data line and the second data line is placed to run orthogonally to the reference word line, and
    at least one of the first reference data line and the second reference data line is placed to run orthogonally to the word line.

8. The nonvolatile semiconductor memory device of claim 1, wherein, in the dummy memory cell, the first reference data line includes first and second interconnects placed to run in parallel with each other in upper and lower wiring layers, respectively, with respect to the second resistance change element,
    the second resistance change element is connected to the first interconnect at one end and to the second interconnect at the other end, and
    the first and second interconnects are short-circuited every plural word lines.

9. The nonvolatile semiconductor memory device of claim 1, wherein each of the plurality of memory cells is a resistive memory cell where the first resistance change element is formed of a resistance change element.

10. The nonvolatile semiconductor memory device of claim 1, wherein each of the plurality of memory cells is a magnetoresistive memory cell where the first resistance change element is formed of a magnetoresistance change element.

11. The nonvolatile semiconductor memory device of claim 1, wherein each of the plurality of memory cells is a phase change memory cell where the first resistance change element is formed of a phase change element.

12. The nonvolatile semiconductor memory device of claim 1, wherein the dummy memory cell includes a wiring layer and a contact connected with the wiring layer, and
a plurality of the dummy memory cells are arranged at substantially the same intervals as intervals at which the plurality of memory cells are arranged.

* * * * *